United States Patent [19]

Turley

[11] Patent Number: 4,496,403
[45] Date of Patent: Jan. 29, 1985

[54] METHOD OF MAKING A COMPOUND SEMICONDUCTOR LASER

[75] Inventor: Stephen E. H. Turley, Harlow, England

[73] Assignee: ITT Industries, Inc., New York, N.Y.

[21] Appl. No.: 445,618

[22] Filed: Nov. 30, 1982

[30] Foreign Application Priority Data

Dec. 1, 1981 [GB] United Kingdom ............... 8136167

[51] Int. Cl.$^3$ ............................................ H01L 21/208
[52] U.S. Cl. .................................. 148/171; 148/172; 29/569 L
[58] Field of Search ............ 148/171, 172; 29/569 L; 372/46

[56] References Cited

U.S. PATENT DOCUMENTS

| | | | |
|---|---|---|---|
| 4,276,098 | 6/1981 | Nelson et al. | 148/171 |
| 4,287,485 | 9/1981 | Hsieh | 148/171 X |
| 4,326,176 | 4/1982 | Aiki et al. | 372/46 X |
| 4,354,898 | 10/1982 | Coldren et al. | 148/171 X |
| 4,355,396 | 10/1982 | Hawrylo et al. | 372/46 |
| 4,366,569 | 12/1982 | Hirao et al. | 372/46 |

Primary Examiner—G. Ozaki
Attorney, Agent, or Firm—John T. O'Halloran; Robert P. Seitter

[57] ABSTRACT

In the manufacture of an InP/(In,Ga) (As,P) buried rib laser, the sides of the laser are profiled to have surfaces extending in {111} A planes down to the junction between the active and lower confining layers, and to have surfaces extending in other planes beneath this junction. In the subsequent epitaxial regrowth nucleation above this junction between the surfaces is discriminated against in favor of growth beneath this junction so that the regrowth up the sides of the rib is automatically temporarily arrested in the vicinity of this junction.

6 Claims, 3 Drawing Figures

METHOD OF MAKING A COMPOUND SEMICONDUCTOR LASER

BACKGROUND OF THE INVENTION

This invention relates to the manufacture of semiconductor lasers, and is concerned particularly with the control of the growth of epitaxial layers in such manufacture.

The construction of various types of sophisticated structures of semiconductor laser has hitherto been inhibited by the difficulties in regulating epitaxial growth so as to achieve an adequate precision in the positioning of boundaries between adjacent layers. One particular problem occurs in the construction of lasers requiring growth registration with positions already defined by previous processing.

SUMMARY OF THE INVENTION

An object of the invention is the devising of a way of regulating epitaxial growth so that it will proceed to the vicinity of a given line and there be temporarily arrested without recourse to the use of a mask physically to effect this arrest.

The present invention is concerned with using the property of different nucleation characteristics for growth on different crystal planes to regulate epitaxial growth. Planes providing easy nucleation will be covered rapidly during epitaxial growth while those on which nucleation is difficult will initially remain uncovered. Thus selective epitaxy can be achieved.

According to the present invention there is provided a method of making a compound semiconductor buried rib heterostructure laser including the steps of epitaxially growing upon a semiconductor substrate three layers comprising an active layer sandwiched between upper and lower passive layers of higher band gap and lower refractive index material than that of the active layer, of selectively etching through said active and passive layers to leave a protruding rib whose sides are profiled having regard to the crystal orientation such that in a subsequent step of epitaxial regrowth the nucleation on the sides of the rib at and above the active layer is discriminated against by said profile in favour of nucleation beneath said active layer whereby in said regrowth the regrowth up the sides of the rib is temporarily arrested in the vicinity of the junction between the active layer and the lower passive layer.

The invention is applicable to lasers fabricated in compound semiconductor materials generally, but will be exemplified in the context of compound semiconductors of the zinc blende type. The selective growth properties are not usually noticeable in the GaAs/(Ga,Al)As system under growth conditions normally used for growth of these materials, but are more pronounced in the growth conditions typically used for liquid phase epitaxy in the InP/(In,Ga)(As,P) system. The reason for this selectivity is believed to originate in the structure of zinc blende type crystals and its manner of growth by liquid phase epitaxy.

In the case of indium phosphide, {111}A surfaces consist exclusively of In atoms trebly bonded to the crystal, while {111}B surfaces have only P atoms which are similarly trebly bonded to the crystal. For growth to occur on these surfaces, atoms must attach themselves to the surface: In atoms must attach themselves to {111}B surfaces, and P atoms to {111}A surfaces. Initially such atoms will be attached to the crystal by only a single bond and thus the bonding is very unstable. In the case of growth from In-based melts (as is typical for liquid phase epitaxy in the InP/(In,Ga)(As,P) system), this instability is compensated on the {111}B surfaces by the frequency with which new bonds are made. However, the P concentration in the melt is much lower than that of In, and therefore the instability of the singly bonded P atom prevents rapid growth on {111}A surfaces. The inhibition of growth on these surfaces can, if desired, be reduced by increasing the super-saturation of the melt. It is also possible that with another growth method the relative growth rates on the A and B planes might be reversed. This may be easier to achieve when using vapour phase epitaxy instead of liquid phase epitaxy.

BRIEF DESCRIPTION OF THE DRAWINGS

An embodiment of the invention will now be described with reference to the accompanying drawings in which.

DETAILED DESCRIPTION OF THE INVENTION

Figure 1:
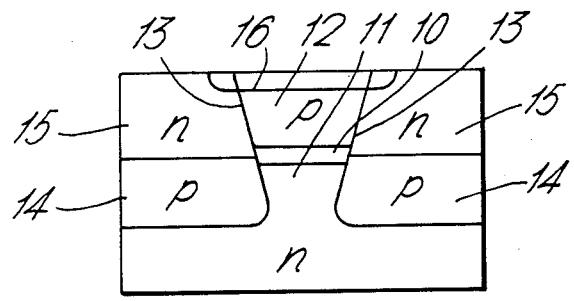
FIG. 1 depicts a schematic cross-section through a theoretical design of a buried rib heterostructure laser.
Figure 2:
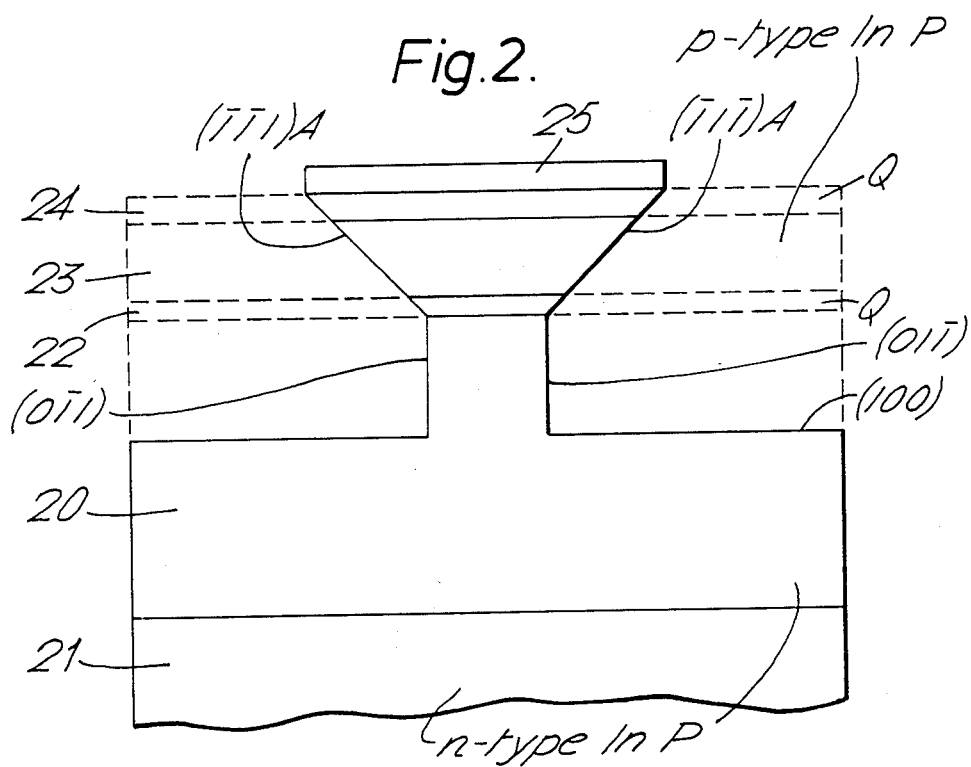
FIGS. 2 and 3 depict successive stages in the manufacture of a buried rib heterostructure laser according to the present invention.

A theoretical design of buried rib heterostructure is depicted in FIG. 1. To make this structure a thin active layer 10 is sandwiched between two passive confining layers 11 and 12 of opposite conductivity type. The active layer has a higher refractive index and lower band gap than both confining layers. This provides optical and carrier confinement in the direction normal to the plane of the layers, i.e. the [100] direction. The resulting structure is then etched to leave a narrow rib extending in the [011] direction which will be the direction of the laser optical cavity. The etchant used to form the rib is normally $Br_2$—$CH_3OH$ which results in {111}A rib walls 13 as shown in FIG. 1. The exposed sides 13 of the resulting rib are then protected by growth of further epitaxial material of lower refractive index and higher band gap than the active layer so as to provide lateral confinement. For this purpose, two layers are grown, a p-type layer 14 adjacent the n-type material of the rib, and an n-type layer 15 adjacent the p-type material. This would be typically followed by a p-type diffusion 16 for contacting purposes. In order for the device to function most efficiently the p-n junction between layers 14 and 15 should register with the active layer 10. This is difficult to achieve with rib walls of a single orientation such as {111}A. FIG. 2 shows how this registry problem is overcome by the use of a rib which is straight sided up to the active region, and tapered above. The initial stages of manufacture of the device of FIG. 2 are substantially the same as those for the manufacture of the device of FIG. 1. Thus an n-type passive layer 20 of InP is grown upon an n-type single crystal substrate 21. This is followed by growth of the quaternary (In,Ga)(As,P) active layer 22, and then growth of a p-type InP passive layer 23. The p-type passive layer is covered with a p-type ternary (In,Ga)As or quaternary (In,Ga)(As,P) capping layer 24 for contacting purposes. Standard photolithographic techniques are then used to provide the resulting structure with a mask 25 of silicon dioxide, typically deposited pyrolytically. This is used for defining the required rib for subsequent etching process steps.

Crystal orientations in the following description are given relative to a {100} wafer surface defined as (100). Initially a bromine-methanol etch is used to etch through the contact layer into the underlying p-passive layer 23. The orientation of the substrate is such that the epitaxial layers are grown on the (100) plane, while the orientation of the masking stripe 25 is in the [011] direction. The bromine methanol etch has the property that it reveals {111}A planes under the edges of a mask, in this instance ($\bar{1}$11)A and ($\bar{1}1\bar{1}$)A, resulting in an inwardly directed taper to the rib. On exposure of the p-passive layer the etchant is changed to an etch consisting of equal proportions by volume of 50% w/w hydrobromic acid and 85% w/w orthophosphoric acid. This etches ternary and quaternary material much more slowly than the binary material of the p-passive layer 23. The ternary or quaternary material of the capping layer 24 therefore acts as a strongly adherent mask for layer 23 with the result that the new etchant also reveals the ( OVS/11/ 1)A and ($\bar{1}1\bar{1}$)A planes. Another feature of this etchant is that the etching tends to be self-limiting upon exposure of the quaternary material of the active layer 22. The bromine methanol etch used for etching the contact layer could in principle be used for etching the active layer, but since it is desired to terminate the etching once the ($\bar{1}$11)A and ($\bar{1}1\bar{1}$)A planes have been exposed down to the underlying n-passive layer, a selective etch is preferred such as a potassium iodide-iodine etch. A suitable etch is provided by 65 gm $I_2$, 113 gm KI, 100 ml $H_2O$. This will remove quaternary material to expose the requisite planes, and attacks the underlying indium phosphide at a much slower rate.

Once the n-passive layer has been exposed the etch is changed for one which will reveal (0$\bar{1}$1) and (01$\bar{1}$) planes instead of ($\bar{1}$11)A and ($\bar{1}1\bar{1}$)A planes so that a junction of planes is produced at the bottom of the active layer. A suitable etch for this purpose is provided by a mixture of four volumes of 85% w/w orthophosphoric acid to one volume of 37% w/w hydrochloric acid. This is used to remove one to two microns from the n-passive layer. A brief etch in nitric acid diluted with an equal volume of water may be used to remove any stains left after the etching with the potassium iodide-iodine etch. The total etch depth is typically in the range three to five microns.

Figure 3:
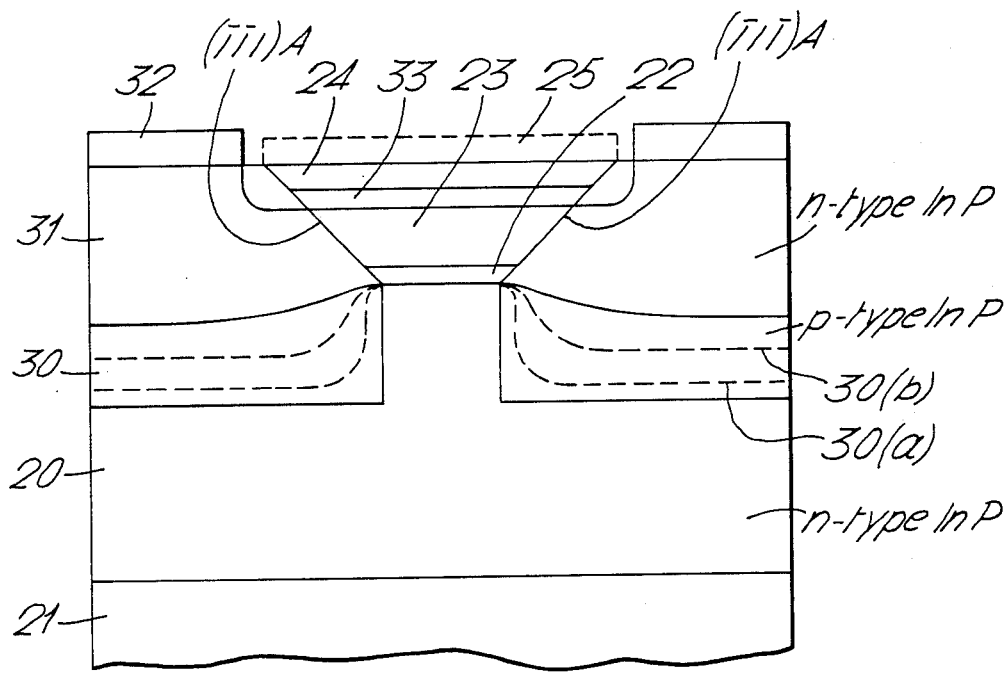

Subsequent growth is by conventional liquid phase epitaxy. Referring now to FIG. 3, the first layer of the subsequent growth is a p-type layer 30 of InP grown to a depth of about one micron or less in regions away from the rib. Right from the start the growth nucleates all the way across the (100) surface from which the rib protrudes and also up the (0$\bar{1}$1) and (01$\bar{1}$) side walls producing a profile substantially as illustrated at 30a. The profile changes as growth proceeds to one substantially as depicted at 30b. Only when the growth planes adjacent the rib approach the (100) plane does nucleation begin significantly to creep up the ($\bar{1}$11)A and ($\bar{1}1\bar{1}$)A planes of the upper part of the rib. The growth of the p-type material of layer 30 is halted before this has occurred to any appreciable extent. The growth of layer 30 is succeeded by the growth of an n-type InP layer 31. This proceeds initially in the same manner as the growth of layer 30 but is continued till the growth has crept all the way up the ($\bar{1}$11)A and ($\bar{1}1\bar{1}$)A planes of the rib. At this stage the mask 25 is replaced by a fresh mask 32 of radio frequency deposited silica suitable for performing a zinc diffusion 33 to provide $p^+$-type material suitable for the making of a good electrical contact.

While the foregoing description has related specifically to a laser grown upon an n-type substrate it is to be understood that a complementary laser structure could be grown using a p-type substrate. For this the etching and growth procedures could be substantially the same, but with the doping types reversed throughout.

While the principles of the invention have been described in connection with a specific laser it is to be clearly understood that this description is made only by way of example and not as a limitation to the scope of the invention as set forth in the accompanying claims.

I claim:

1. A method of making a compound semiconductor buried rib heterostructure laser constructed in the InP-/(In,Ga)(As,P) semiconductive system including the steps of growing by liquid phase epitaxy upon a semiconductive substrate three layers comprising an active layer sandwiched between upper and lower pasive layers of higher band gap and lower refractive index material than that of the active layer, of selectively etching through said active and passive layers to leave a protruding rib whose sides are profiled having regard to the crystal orientation such that in a subsequent step of epitaxial regrowth the nucleation on the sides of the rib at and above the active layer is discriminated against by said profile in favour of nucleation beneath said active layer whereby in said regrowth the regrowth up the sides of the rib is temporarily arrested in the vicinity of the junction between the active layer and the lower passive layer.

2. A method as claimed in claim 1, wherein the growth uses an indium rich melt and the profiling of the rib is such as to provide A-plane surfaces which constitute the portions of the sides of the rib on which the nucleation of the epitaxial regrowth is discriminated against.

3. A method as claimed in claim 2, wherein said A-planes surfaces are {111}A planes.

4. A method as claimed in claim 3, wherein said A-plane surfaces are ($\bar{1}$11)A and ($\bar{1}1\bar{1}$)A planes extending part of the way down the sides of a rib extending in the [011] direction and protruding from a surface extending in the (100) plane.

5. A method as claimed in claim 4 wherein the profiling of the rib is such as to provide surfaces extending in the (0$\bar{1}$1) and (01$\bar{1}$) planes which constitute the portions of the sides of the rib on which the nucleation of the epitaxial regrowth is discriminated in favour of.

6. A method as in claim 1 wherein said rib is profiled to be straight sided from the substrate to the active region and tapered above.

* * * * *